US012581246B2

(12) United States Patent
Ciciotti et al.

(10) Patent No.: US 12,581,246 B2
(45) Date of Patent: Mar. 17, 2026

(54) GLITCH-LESS ACOUSTIC RANGE OPTIMIZATION FOR MICROPHONES

(71) Applicant: Infineon Technologies AG, Neubiberg (DE)

(72) Inventors: Fulvio Ciciotti, Bad Bleiberg (AT); Jose Luis Ceballos, Villach (AT); Luca Sant, Cassacco (IT); Alessandro Caspani, Villach (AT); Andreas Wiesbauer, Pörtschach a. W. (AT)

(73) Assignee: Infineon Technologies AG, Neubiberg (DE)

( * ) Notice: Subject to any disclaimer, the term of this patent is extended or adjusted under 35 U.S.C. 154(b) by 345 days.

(21) Appl. No.: 18/337,959

(22) Filed: Jun. 20, 2023

(65) Prior Publication Data

US 2024/0430622 A1 Dec. 26, 2024

(51) Int. Cl.
*H04R 1/04* (2006.01)
*H03H 7/24* (2006.01)
*H04R 19/04* (2006.01)

(52) U.S. Cl.
CPC .............. *H04R 19/04* (2013.01); *H03H 7/24* (2013.01); *H04R 2201/003* (2013.01)

(58) Field of Classification Search
CPC ........ H04R 19/005; H04R 19/04; H04R 3/00; H04R 19/016; H04R 3/06; H04R 1/04; H04R 2201/003; H04R 2410/03
See application file for complete search history.

(56) References Cited

U.S. PATENT DOCUMENTS

| | | | | |
|---|---|---|---|---|
| 9,635,460 | B2 * | 4/2017 | Schultz ................... | H04R 3/06 |
| 10,171,046 | B2 * | 1/2019 | Kropfitsch ............. | H04R 19/04 |
| 10,250,996 | B1 * | 4/2019 | Holzmann ........... | H04R 19/016 |
| 2010/0310096 | A1 * | 12/2010 | Josefsson ................. | H04R 3/06 |
| | | | | 381/113 |

FOREIGN PATENT DOCUMENTS

WO        WO-2005099098 A1 * 10/2005 ............ H03M 3/484

* cited by examiner

*Primary Examiner* — Ryan Robinson
(74) *Attorney, Agent, or Firm* — Slater Matsil, LLP

(57) ABSTRACT

An attenuator circuit includes a microelectromechanical system (MEMS) device having an output for providing an analog output voltage; a switch having a first controlled node coupled to an output of the MEMS device, a second controlled node for receiving a replica analog output voltage, and a control node for receiving a control signal; and a capacitor coupled to the switch.

20 Claims, 8 Drawing Sheets

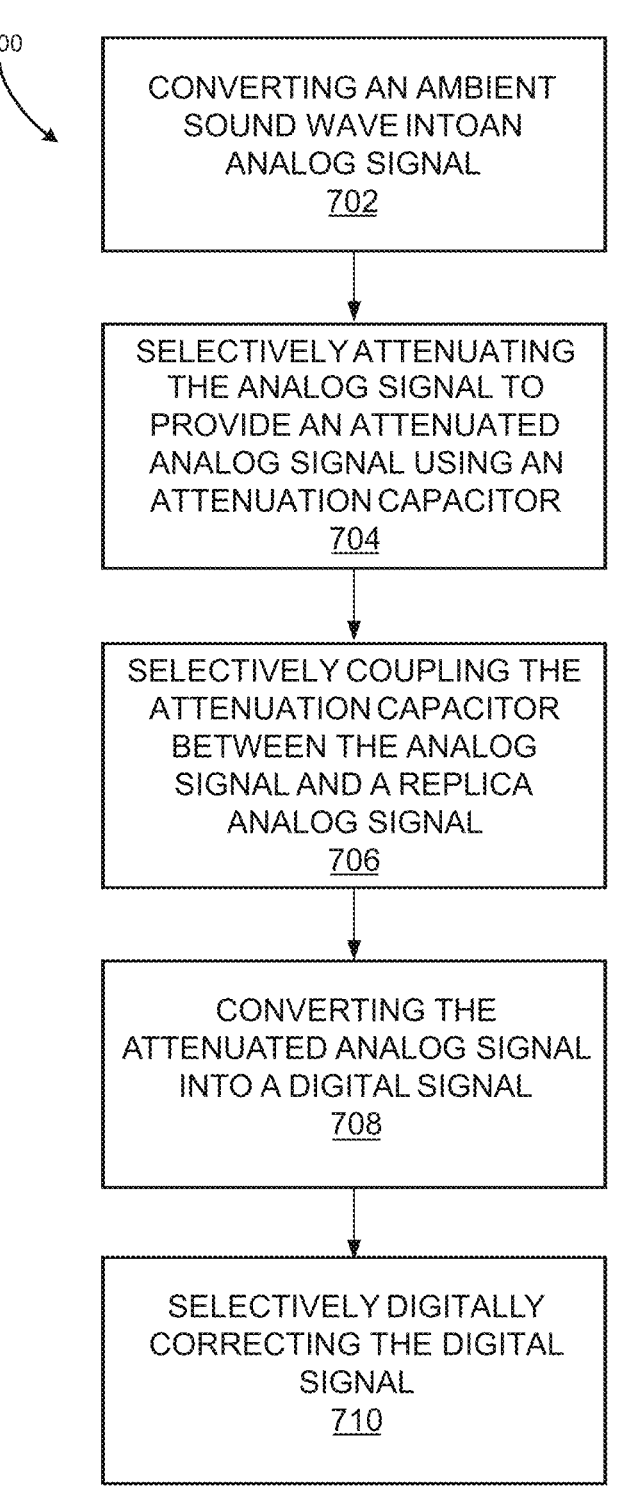

700

CONVERTING AN AMBIENT
SOUND WAVE INTO AN
ANALOG SIGNAL
702

SELECTIVELY ATTENUATING
THE ANALOG SIGNAL TO
PROVIDE AN ATTENUATED
ANALOG SIGNAL USING AN
ATTENUATION CAPACITOR
704

SELECTIVELY COUPLING THE
ATTENUATION CAPACITOR
BETWEEN THE ANALOG
SIGNAL AND A REPLICA
ANALOG SIGNAL
706

CONVERTING THE
ATTENUATED ANALOG SIGNAL
INTO A DIGITAL SIGNAL
708

SELECTIVELY DIGITALLY
CORRECTING THE DIGITAL
SIGNAL
710

Fig. 7

GLITCH-LESS ACOUSTIC RANGE OPTIMIZATION FOR MICROPHONES

TECHNICAL FIELD

The present invention relates generally to a "glitch-less" acoustic range optimization for microphones and, in particular embodiments, to a corresponding system and method.

BACKGROUND

In a typical microphone system, a desired output sensitivity is achieved through the combined gains of multiple components in the signal path chain including a microelectro-mechanical system (MEMS) device, an analog front-end, and various digital stages. However, in a typical microphone system, there is a trade-off between the signal-to-noise ratio (SNR) and acoustic overload point (AOP), and optimizing the entire system often involves adjusting the gain values of each component. Normally, this gain adjustment is carried out during reset phases and is not intended to be modified during normal operation.

Using a fixed gain approach therefore limits the flexibility of the microphone. As a result, the latest silicon microphone families adopt logarithmic anti-logarithmic structures and achieve seamless transitions between different operating modes. For example, these microphones may have a mode with a lower AOP and a higher SNR, as well as a mode with a higher AOP and a lower SNR. Achieving these modes requires dynamically changing the gain of the front-end while maintaining signal integrity and minimizing audio artifacts.

SUMMARY

According to an embodiment, an attenuator circuit comprises a microelectromechanical system (MEMS) device having a first output for providing a first analog output voltage; a first switch having a first controlled node coupled to a first output of the MEMS device, a second controlled node for receiving a first replica analog output voltage, and a control node for receiving a control signal; and a first capacitor coupled to the first switch.

According to an embodiment, a microphone comprises a MEMS device for generating an analog signal in response to ambient sound waves; a switchable capacitive attenuation component coupled to the MEMS device, the switchable capacitive attenuation component comprising an attenuation capacitor; a signal path coupled to the switchable capacitive attenuation component; and a switchable digital gain correction component coupled to the signal path, wherein the switchable capacitive attenuation component switches between a first mode of operation to a second mode of operation without any charge transfer from or to the attenuation capacitor.

According to an embodiment, a method comprises converting an ambient sound wave into an analog signal; selectively attenuating the analog signal to provide an attenuated analog signal using an attenuation capacitor; selectively coupling the attenuation capacitor between the analog signal and a replica analog signal; converting the attenuated analog signal into a digital signal; and selectively digitally correcting the digital signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 is a flow chart of an attenuation method for a digital microphone, according to an embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

Figure 1A:
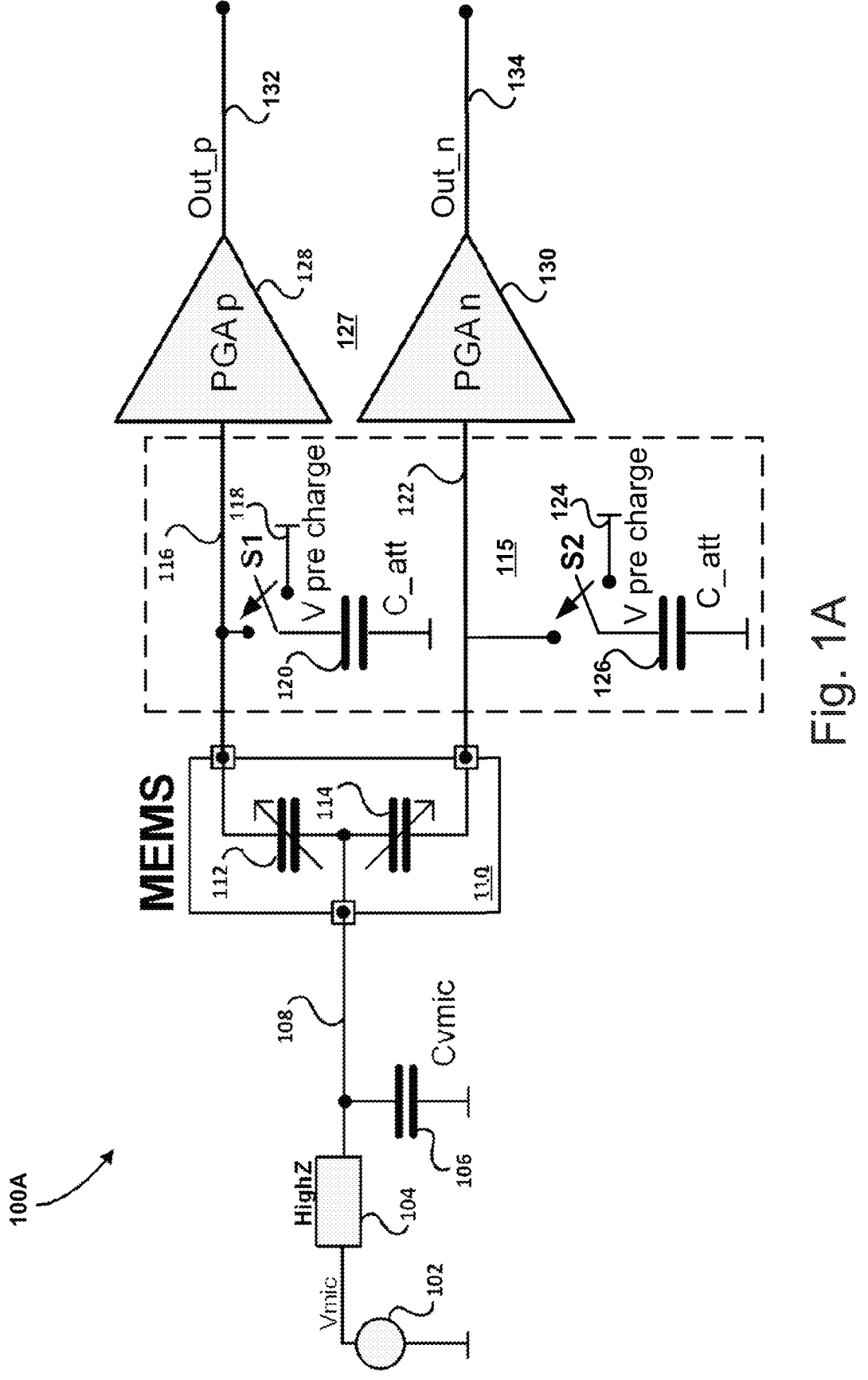
FIG. 1A is a schematic diagram of an attenuator circuit, according to an embodiment.
Figure 1B:
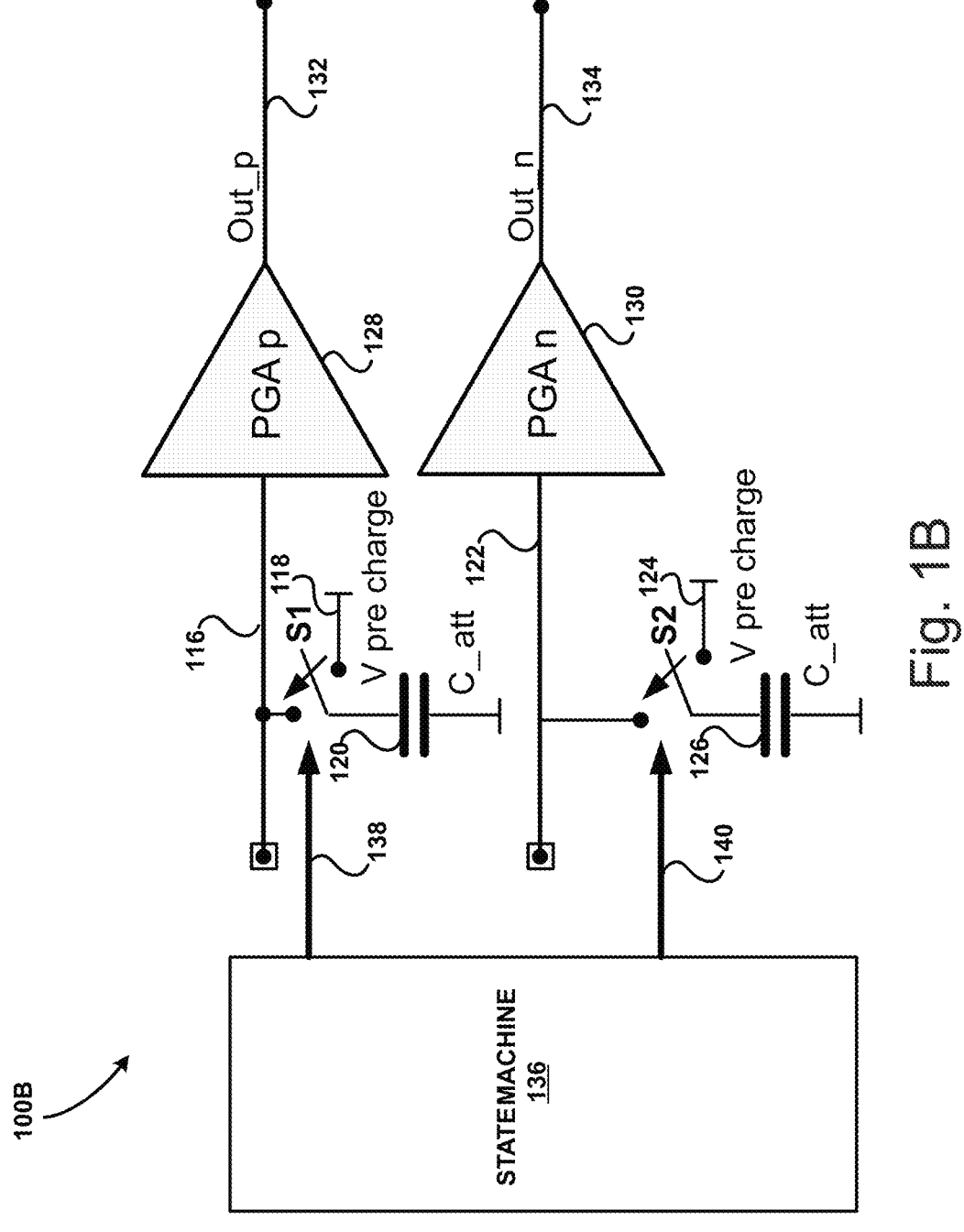
FIG. 1B is a schematic diagram of the attenuator circuit of FIG. 1A, but showing a state machine for providing control signals to switches in the attenuator circuit, according to an embodiment.

A digital microphone includes a MEMS device for generating an analog signal responsive to sound waves, and an application-specific integrated circuit (ASIC) for converting and processing the analog signal into a digital output signal. According to embodiments, the analog signal is attenuated directly at the input of the ASIC, by means of one or more additional (programmable) attenuation capacitor(s), which create a capacitive divider with the capacitance of the MEMS device. To avoid glitches (audible artifacts) when connecting and disconnecting the capacitors, a plate connected to the signal side of the MEMS device (as is shown in FIG. 1A and FIG. 1B and described in further detail below) is always pre-charged to a voltage level tracking the analog signal. This configuration ensures that there is no charge transfer to or from the attenuation capacitor(s) (and therefore no glitches) since the same voltage is always present on the attenuation capacitor when connecting to the input node.

Figure 2:
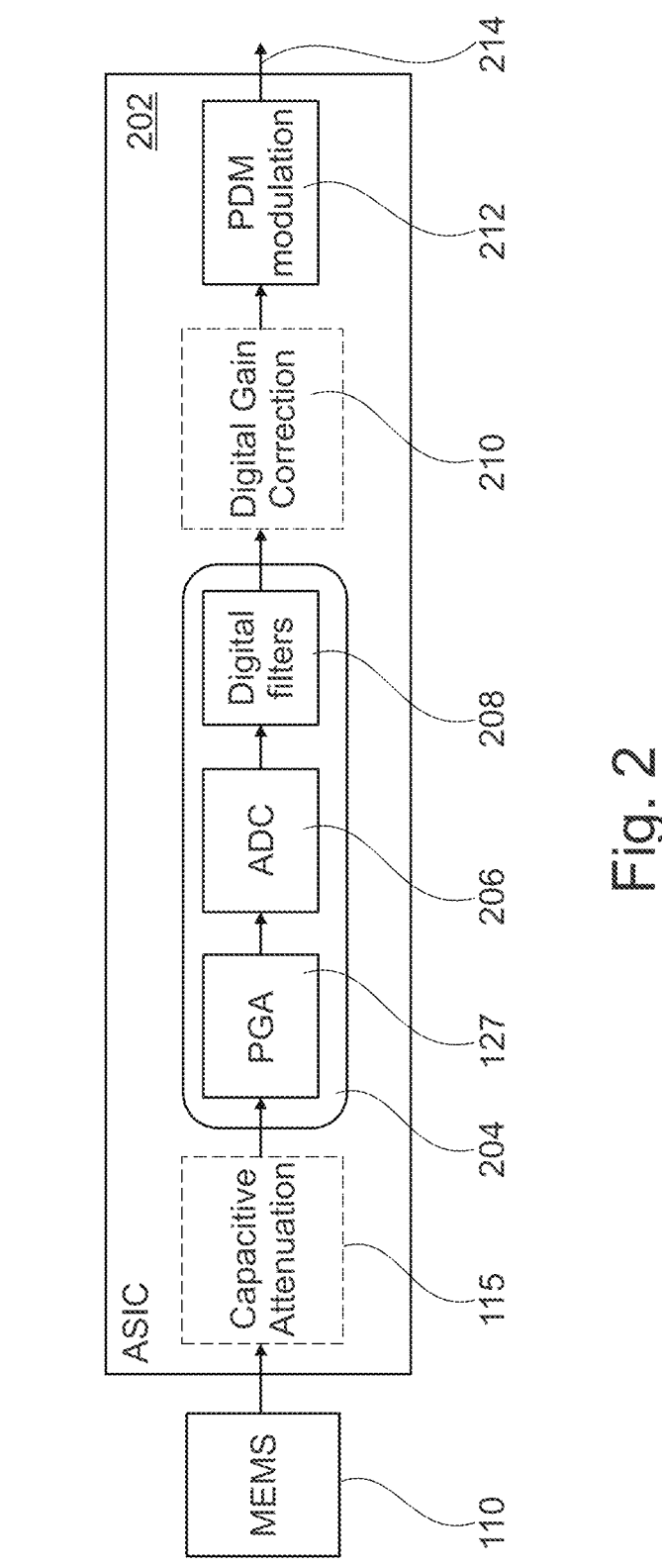
FIG. 2 is a block diagram of a digital microphone includes a capacitive attenuation block and a digital gain correction block, according to an embodiment.

FIG. 1A shows an implementation of the attenuation, according to an embodiment, by adding one or more attenuation capacitor(s) (C_att) that are optionally programmable directly at the input of the ASIC. An advantage of attenuating the signal directly at the input is that the full signal chain of the digital microphone receives the same gain variation, hence there is no need to re-adjust the gains of each individual component. Only a simple digital calibration at the end of the chain is required to set the final sensitivity level as is shown in FIG. 2. Both FIG. 1A, which shows the MEMS device and the switchable capacitive attenuation component, and FIG. 2, which shows the complete signal processing chain of the digital microphone and the ASIC components, are described in further detail below.

According to an embodiment, it is advantageously possible to switch operational modes of a digital microphone in the analog domain at any point in time, in contrast to implementations that rely on switching only at the zero-crossing point of the analog signal to minimize glitches, thus requiring zero-crossing detectors and limiting the flexibility of a complete signal level independent implementation as described herein. If desired, the zero-crossing functionality can be used in addition to the pre-charging implementation described herein for additional performance improvements such as a further reduction of switchable audio artifacts.

Advantageously, the control of the switching between operating modes (compression/decompression) can be done either independently from the input (controlled with a digital state machine and/or external command) or related to the analog input (a comparator with programmable thresholds). The attenuation mode can be controlled externally by the microphone user application, and only a simple synchronization between the switching time in analog and the digital reconstructed signal must be implemented in the ASIC.

FIG. 1A is a schematic diagram of an attenuator circuit 100A, according to an embodiment. Attenuator circuit 100A comprises a microelectromechanical system (MEMS) device 110 having a first output (node 116) for providing a first analog output voltage. An input (node 108) of MEMS device 110 is found at a plate of capacitive element 112, and a first output (node 116) of MEMS device 110 is found at another plate of capacitive element 112. Biasing circuitry for MEMS device 110 includes bias voltage source 102 designated Vmic, a high impedance biasing resistor 104, and an input capacitor 106 designated Cvmic. The junction of high impedance biasing resistor and input capacitor 106 is coupled to input node 108. A switchable capacitive attenuation component 115 is coupled to the first output of the MEMS device 110 at node 116, according to an embodiment. The switchable capacitive attenuation component 115 comprises a first switch S1 having a first controlled node coupled to a first output of the MEMS device 110 at node 116, a second controlled node (node 118) for receiving a first replica analog output voltage designated "V_pre_charge", and a control node for receiving a control signal. The control signal for the first switch S1 is shown and described below with respect to FIG. 1B. In an embodiment switch S1 can comprise two or more NMOS or PMOS transistors. The switchable capacitive attenuation component 115 also includes a first attenuation capacitor 120 designated C_att coupled to the first switch S1. The switchable capacitive attenuation component 115 can be fabricated inside of an ASIC that includes other signal processing components, and is explained in further detail below. For example, a first programmable gain amplifier (PGA) 128 has an input coupled to node 116 and an output coupled to output node 132 designated "Out_p", and is also fabricated inside of the ASIC.

The first switch S1 is configured for coupling the first capacitor 120 to the first output of the MEMS device 110 in a first mode of operation (for example a mode with a higher AOP and a lower SNR), and for coupling the first capacitor 120 to a source of the first replica analog output voltage in a second mode of operation (for example a mode with a lower AOP and a higher SNR), without any charge transfer from or to the first capacitor 120 when switching between the first mode of operation and the second mode of operation.

The attenuator circuit 100A of FIG. 1A, shows that the MEMS device 110 has a second output at node 122 for providing a second analog output voltage, and where the switchable capacitive attenuation component 115 further comprises a second switch S2 and a second attenuation capacitor 126. The second switch S2 has a first controlled node coupled to the second output of the MEMS device 110 at node 122, a second controlled node for receiving a second replica analog output voltage at node 124 (also designated V_pre_charge), and a control node for receiving the control signal. A second attenuation capacitor 126, also designated C_att, is coupled to the second switch S2. FIG. 1A also shows, a second programmable gain amplifier 130, which has an input coupled to node 122 and an output coupled to output node 134 designated "Out_n", and is also fabricated inside of the ASIC in an embodiment. The first programmable gain amplifier 128 and the second programmable gain amplifier 130 can be collectively referred to as a PGA amplifier 127.

The second switch S2 is configured for coupling the second attenuation capacitor 126 to the second output of the MEMS device at node 122 in the first mode of operation, and for coupling the second attenuation capacitor 126 to a source of the second replica analog output voltage at node 124 in a second mode of operation, without any charge transfer from or to the second attenuation capacitor 126 when switching between the first mode of operation and the second mode of operation.

FIG. 1B is a schematic diagram of the attenuator circuit of FIG. 1A, wherein the MEMS device 110 and associated biasing circuitry are omitted for the sake of clarity, but showing a state machine 136 for providing control signals at output nodes 138 and 140 to switches S1 and S2, respectively, in the attenuator circuit 100B, according to an embodiment. State machine 136 comprises a microprocessor, comparator, window comparator, or other similar component for providing control signals. State machine 136 can also be fabricated in the ASIC, according to an embodiment. In other embodiments, the control signals are provided externally to the digital microphone and thus state machine 136 can be omitted.

FIG. 2 is a block diagram of a digital microphone 200 includes a switchable capacitive attenuation component 115 and a digital gain correction block 210, according to an embodiment. The gain of the digital gain correction block 210 is used to "correct" the attenuation provided by the switchable capacitive attenuation component 115, so that the overall gain of the digital microphone is the same in the first mode of operation and in the second mode of operation. The block diagram of digital microphone 200 shows the MEMS device 110, and the ASIC 202 coupled to the output of MEMS device 110. ASIC 202 includes the switchable capacitive attenuation component 115, a signal processing and digital-to-analog conversion block 204, the digital gain correction block 210, and an optional one-bit pulse density modulation (PDM) block 212 having an output coupled to the output of the digital microphone at node 214. The signal processing and digital-to-analog conversion block 204 further comprising one or more programmable gain (PGA) amplifier(s) 127 coupled to the MEMS device 110, an analog-to-digital converter (ADC) 206 coupled to the one or more PGA(s); and one or more digital filters 208 coupled to the output of PGA 127. The output of the one or more digital filters 208 is coupled to the input of the digital gain correction block 210. In an embodiment, the digital gain correction component 210 comprises a digital multiplier to provide a digital gain to the digital output of ADC 206.

Figure 3:
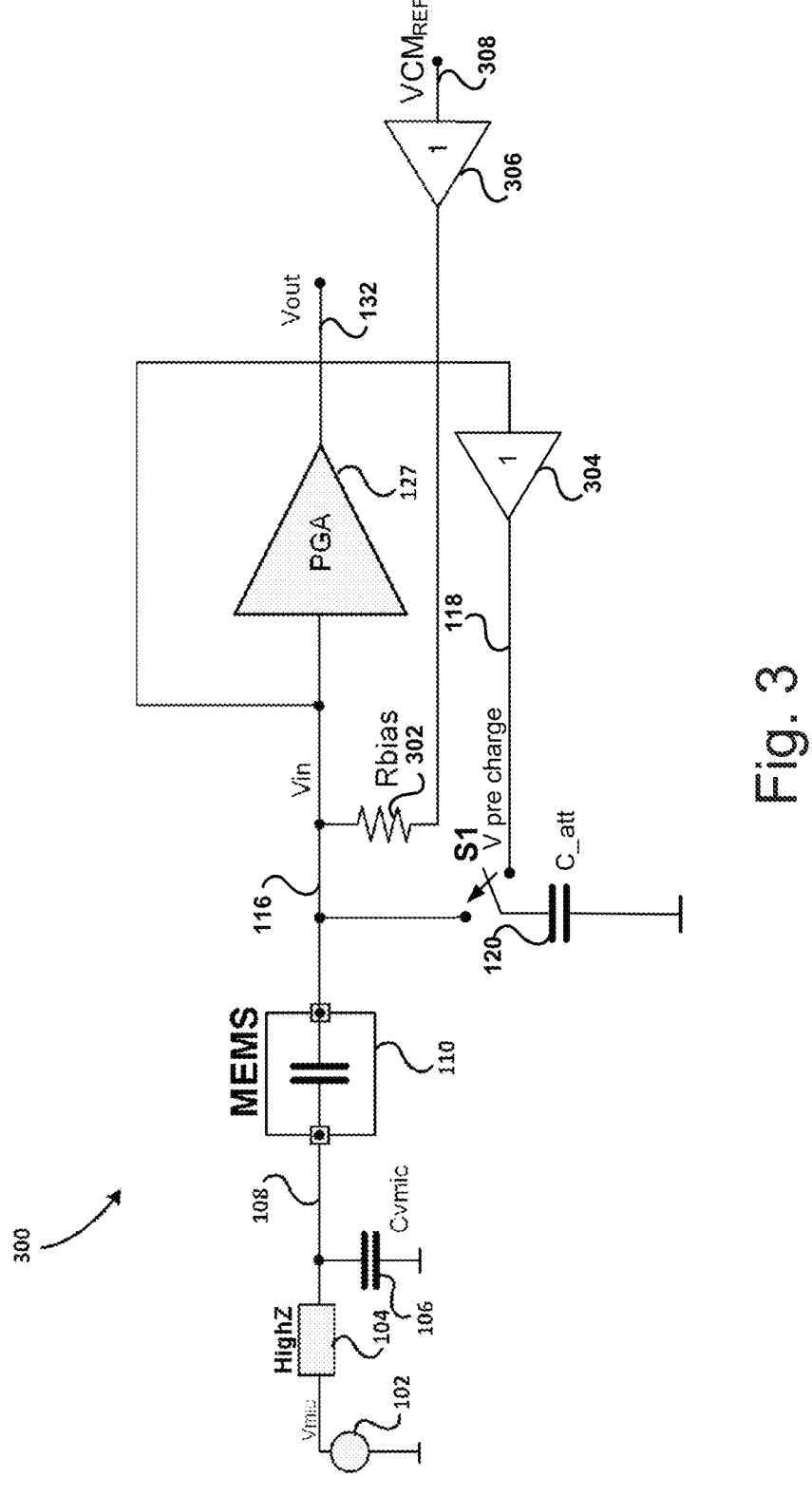
FIG. 3 is a simplified schematic diagram of an attenuator circuit including circuitry for generating a tracking pre-charge voltage, according to an embodiment.

FIG. 3 is a simplified schematic diagram of an attenuator circuit 300 including circuitry for generating a tracking precharge voltage, according to an embodiment. The biasing circuit for the MEMS device 110 including bias voltage source 102, high impedance biasing resistor 104, and input capacitor 106 were all previously described. Switch S1, attenuation capacitor 120, and PGA 127 coupled to output node 132 were also previously described. Attenuator circuit 300 further comprising a first buffer amplifier 304 having an input coupled to the first output of the MEMS device 110 at node 116, and an output for providing the first replica analog output voltage (V_pre_charge) at node 118. Attenuator circuit 300 of further comprises a second buffer amplifier 306 having an input for receiving a common mode voltage (VCM$_{REF}$) at node 308; and a bias resistor 302 designated Rbias coupled between an output of the second buffer amplifier 306 and the first output of the MEMS device 110 at node 116. In operation, the analog voltages at node 116 (Vin, the output voltage of the MEMS device 110) and at node 118 (V_pre_charge, the attenuation capacitor precharge voltage, or "replica" voltage) are substantially the same and track each other seamlessly and continuously during the first and second modes of operation, without glitches or audio artifacts at the transitions between the first and second modes of operation.

Figure 4:
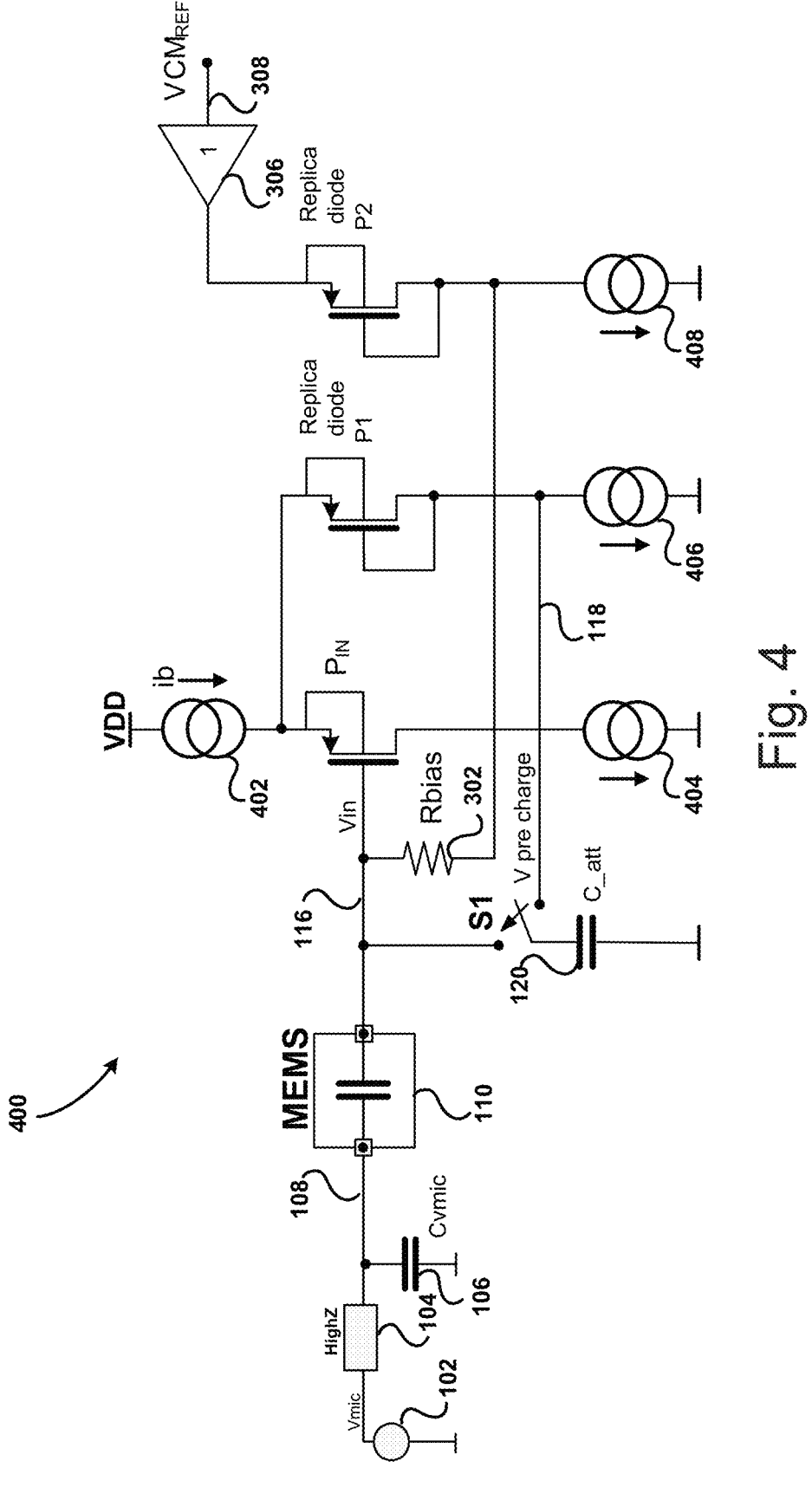
FIG. 4 is a more detailed schematic diagram of an attenuator circuit including circuitry for generating a tracking pre-charge voltage, according to an embodiment.

FIG. 4 is a more detailed schematic diagram of an attenuator circuit 400 including circuitry for generating a tracking pre-charge voltage (V_pre_charge), according to an embodiment. The top plate of the attenuating capacitor (C_att) is always pre-charged by a replica PMOS diode (P1), which tracks the input signal (Vin) by shifting down the output of the PMOS source follower (Pin) exactly by one threshold voltage. Matching between PMOS devices and NMOS current sources ensure that V_pre_charge is always an exact replica of Vin. This ensures minimal glitches at node 116, since there is no charge transfer when switching between modes, even in the presence of a high input signal. The same implementation can be extended to a fully differential system and to different amplifier topologies e.g. a super source follower, i.e. a current feedback based PGA. Attenuation capacitor C_att can be implemented as an array of fuse-programmable capacitors. The capacitive array can be implemented as a single-ended array, two single-ended arrays, or a differential array. If a differential array is used, the area of the array is advantageously smaller than two single-ended arrays. In some embodiments the differential array is up to four times smaller than using two single-ended arrays. A differential programmable array is described in further detail below with respect to FIG. 6.

The attenuator circuit 400 includes a MEMS device 110 and accompanying biasing circuitry, switch S1, and attenuation capacitor C_att, all previously discussed. Attenuation circuit 400 further comprises a transistor (P$_{IN}$) having a gate coupled to the output of the MEMS device 110 at node 116, and a current path (current flowing from source to drain) coupled between a first current source 402 and a second current source 404. A first replica diode (P1) having a current path coupled between the current path of the transistor and a third current source 406. In other words, the source of transistor PIN is coupled to the sourced of the first replica diode (P1). The first replica diode P1 is therefore configured for providing the first replica analog output voltage at node 118. The transistor P1 comprises a first PMOS transistor, wherein the body terminal is coupled to the source, in an embodiment. The first replica diode P1 comprises a second PMOS transistor matched to the first PMOS transistor, wherein the second PMOS transistor is in a diode-connected configuration, and wherein the body terminal is coupled to the source, in an embodiment.

The attenuator circuit 400 further comprises buffer amplifier 306 (previously discussed) having an input for receiving a common mode voltage VCMREF at node 308, and a second replica diode (P2) coupled to the output of buffer amplifier 306. A fourth current source 408 is coupled to the second replica diode P2, and a bias resistor Rbias is coupled between the second replica diode P2 and the first output of the MEMS device 110 at node 116. The second replica diode P2 comprises a third PMOS transistor, in diode-connected configuration, matched to the first PMOS transistor in an embodiment. Current source 404, current source 406, and current source 408 comprise matched NMOS transistors in an embodiment.

Figure 5:
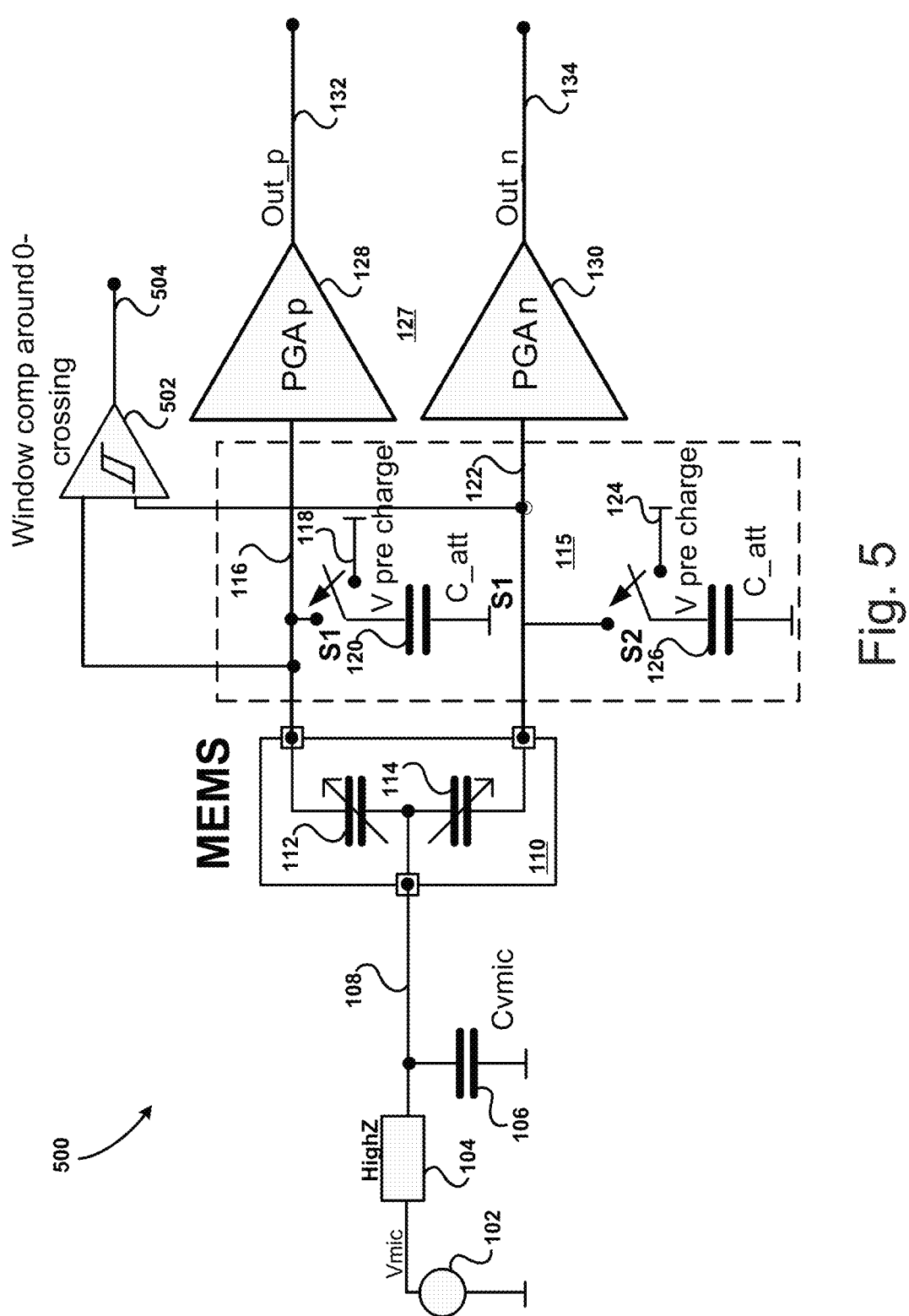
FIG. 5 is a schematic diagram of an attenuator circuit including a zero-crossing detection circuit, according to an embodiment.

FIG. 5 is a schematic diagram of an attenuator circuit 500 including a zero-crossing detection circuit, according to an embodiment. All of the components shown in FIG. 5, except for the zero-crossing detection circuit has been shown and described with respect to FIG. 1A. In an embodiment the zero-crossing detection circuit comprises a comparator 502 having a first input coupled to the first output of the MEMS device 110 at node 116, a second input coupled to the second output of the MEMS device 110 at node 122, and an output coupled to node 504 configured for providing the control signal to switches S1 and S2. In an embodiment, comparator 502 comprises a window comparator that outputs a signal, such as a logic one, when the voltage difference between the first input and the second input are within a predetermined voltage window.

Figure 6:
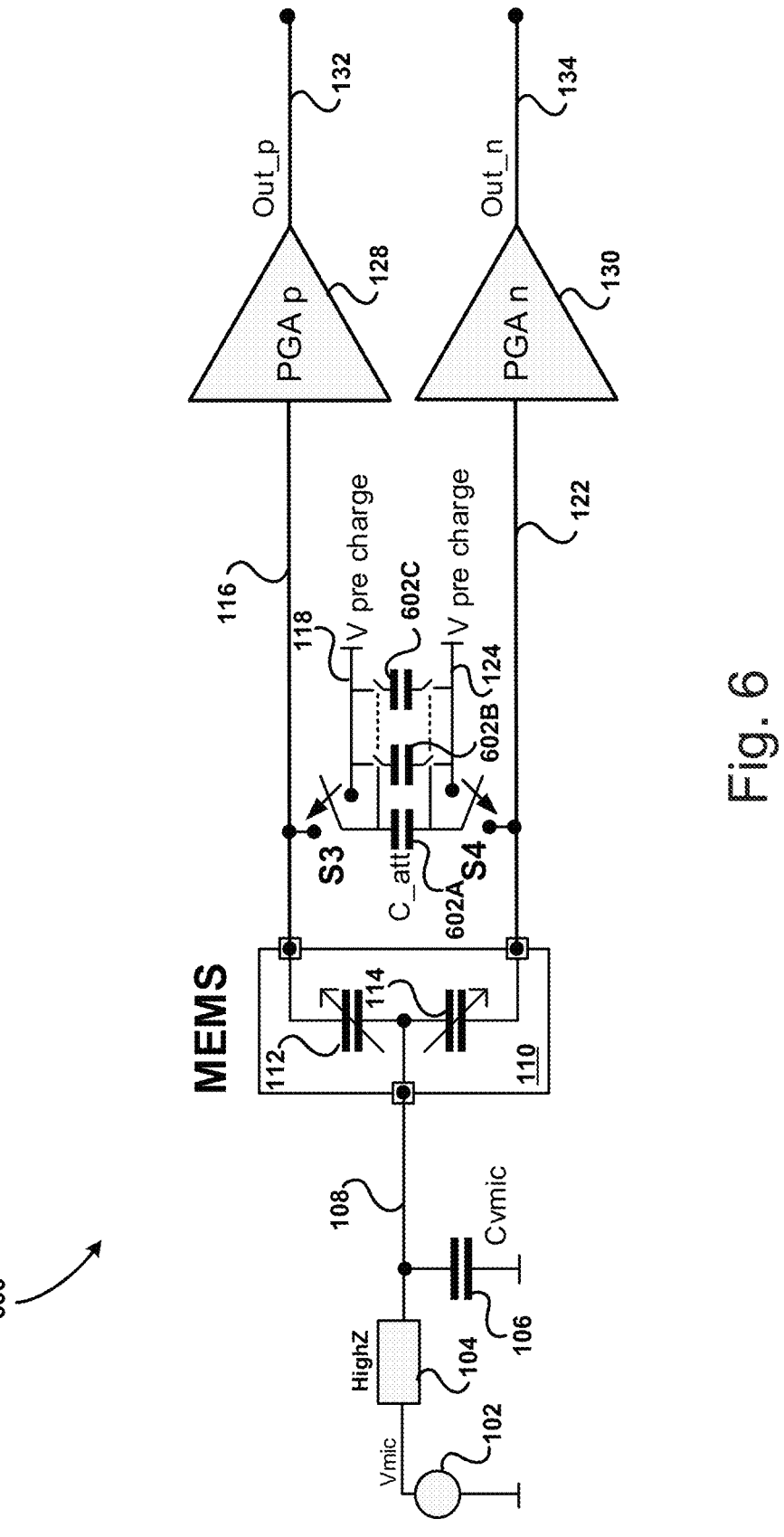
FIG. 6 is a schematic diagram of a differential attenuator circuit including a trimmable attenuator capacitor, according to an embodiment.

FIG. 6 is a schematic diagram of a differential attenuator circuit 600 including a trimmable attenuator capacitor array, according to an embodiment. Differential attenuator circuit 600 includes MEMS device 110 and accompanying biasing circuitry, PGA 128, and PGA 130, all previous described and shown in FIG. 1A. In attenuator circuit 600 the attenuator capacitor array includes an attenuation capacitor 602A (C_att) is parallel with a plurality of trimmable capacitors. In FIG. 6, a first trimmable capacitor 602B and a second trimmable capacitor 602C are shown. Any number of trimmable capacitors, however, can be used. The trimmable capacitors comprise fuse programmable capacitors including fuses coupled to the top plate and bottom plate of the capacitor. The trimmable capacitors are trimmed in order to precisely match the capacitive of the capacitive elements in the MEMS device 110, in an embodiments. The trimmable attenuator capacitor array, including capacitor 602A, and trimmable capacitors 602B and 602C, are coupled between the precharge voltages at node 118 and node 122. These precharge voltages track the analog voltages from MEMS device 110 at node 116 and node 122. Node 118 is selectively coupled to node 116 by the action of switch S3, and node 124 is selectively coupled to node 122 by the action of switch S4, in order to switch between the first and second modes of operation.

In summary, a microphone has been described comprising a MEMS device for generating an analog signal in response to ambient sound waves; a switchable capacitive attenuation component coupled to the MEMS device, the switchable capacitive attenuation component comprising an attenuation capacitor; a signal path coupled to the switchable capacitive attenuation component; and a switchable digital gain correction component coupled to the signal path, wherein the switchable capacitive attenuation component switches between a first mode of operation to a second mode of operation without any charge transfer from or to the attenuation capacitor.

FIG. 7 is a flow chart of an attenuation method 700 for a digital microphone, according to an embodiment, wherein the method comprises converting an ambient sound wave into an analog signal at step 702; selectively attenuating the analog signal to provide an attenuated analog signal using an attenuation capacitor at step 704; selectively coupling the attenuation capacitor between the analog signal and a replica analog signal at step 706; converting the attenuated analog signal into a digital signal at step 708; and selectively digitally correcting the digital signal at step 710.

Example embodiments of the present invention are summarized here. Other embodiments can also be understood from the entirety of the specification and the claims filed herein.

Example 1. According to an embodiment, an attenuator circuit comprises a microelectromechanical system (MEMS) device having a first output for providing a first analog output voltage; a first switch having a first controlled node coupled to a first output of the MEMS device, a second controlled node for receiving a first replica analog output voltage, and a control node for receiving a control signal; and a first capacitor coupled to the first switch.

Example 2. The attenuator circuit of Example 1, wherein the first switch is configured for coupling the first capacitor to the first output of the MEMS device in a first mode of operation, and for coupling the first capacitor to a source of the first replica analog output voltage in a second mode of operation, without any charge transfer from or to the first capacitor when switching between the first mode of operation and the second mode of operation.

Example 3. The attenuator circuit of any of the above claims, wherein the MEMS device has a second output for providing a second analog output voltage, the attenuator circuit further comprising a second switch having a first controlled node coupled to the second output of the MEMS device, a second controlled node for receiving a second replica analog output voltage, and a control node for receiving the control signal; and a second capacitor coupled to the second switch.

Example 4. The attenuator circuit of any of the above claims, wherein the second switch is configured for coupling the second capacitor to the second output of the MEMS device in a first mode of operation, and for coupling the second capacitor to a source of the second replica analog output voltage in a second mode of operation, without any charge transfer from or to the second capacitor when switching between the first mode of operation and the second mode of operation.

Example 5. The attenuator circuit of any of the above claims, further comprising a state machine for providing the control signal.

Example 6. The attenuator circuit of any of the above claims, wherein the state machine comprises a microprocessor, comparator, or window comparator.

Example 7. The attenuator circuit of any of the above claims, further comprising an amplifier coupled to the first output of the MEMS device; an analog-to-digital converter (ADC) coupled to the amplifier; and a digital gain correction component coupled to the ADC.

Example 8. The attenuator circuit of any of the above claims, wherein a digital gain of the digital gain correction component is configured to compensate for an attenuation of the MEMS device provided by the first capacitor.

Example 9. The attenuator circuit of any of the above claims, wherein the digital gain correction component comprises a digital multiplier.

Example 10. The attenuator circuit of any of the above claims, further comprising a first buffer amplifier having an input coupled to the first output of the MEMS device, and an output for providing the first replica analog output voltage.

Example 11. The attenuator circuit of any of the above claims, further comprising a second buffer amplifier having an input for receiving a common mode voltage; and a bias resistor coupled between an output of the second buffer amplifier and the first output of the MEMS device.

Example 12. The attenuator circuit of any of the above claims, further comprising a transistor having a gate coupled to the first output of the MEMS device, and a current path coupled between a first current source and a second current source; a first replica diode having a current path coupled between the current path of the transistor and a third current source, wherein the first replica diode is configured for providing the first replica analog output voltage.

Example 13. The attenuator circuit of any of the above claims, wherein the transistor comprises a first PMOS transistor, and wherein the first replica diode comprises a second PMOS transistor matched to the first PMOS transistor.

Example 14. The attenuator circuit of any of the above claims, further comprising a buffer amplifier having an input for receiving a common mode voltage; a second replica diode coupled to the buffer amplifier; a fourth current source coupled to the second replica diode; and a bias resistor coupled between the second replica diode and the first output of the MEMS device.

Example 15. The attenuator circuit of any of the above claims, wherein second replica diode comprises a third PMOS transistor matched to the first PMOS transistor.

Example 16. The attenuator circuit of any of the above claims, further comprising a comparator having a first input coupled to the first output of the MEMS device, a second input coupled to the second output of the MEMS device, and an output configured for providing the control signal.

Example 17. The attenuator circuit of any of the above claims, wherein the comparator comprises a window comparator.

Example 18. The attenuator circuit of any of the above claims, wherein the first capacitor comprises a plurality of trimmable capacitors.

Example 19. A microphone comprising a MEMS device for generating an analog signal in response to ambient sound waves; a switchable capacitive attenuation component coupled to the MEMS device, the switchable capacitive attenuation component comprising an attenuation capacitor; a signal path coupled to the switchable capacitive attenuation component; and a switchable digital gain correction component coupled to the signal path, wherein the switchable capacitive attenuation component switches between a first mode of operation to a second mode of operation without any charge transfer from or to the attenuation capacitor.

Example 20. According to an embodiment, a method comprises converting an ambient sound wave into an analog signal; selectively attenuating the analog signal to provide an attenuated analog signal using an attenuation capacitor; selectively coupling the attenuation capacitor between the analog signal and a replica analog signal; converting the attenuated analog signal into a digital signal; and selectively digitally correcting the digital signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An attenuator circuit comprising:
a microelectromechanical system (MEMS) device having a first output for providing a first analog output voltage;
a first switch having a first controlled node coupled to the first output of the MEMS device, a second controlled node for receiving a first replica analog output voltage, and a control node for receiving a control signal; and
a first capacitor coupled to the first switch.

2. The attenuator circuit of claim 1, wherein the first switch is configured for coupling the first capacitor to the first output of the MEMS device in a first mode of operation, and for coupling the first capacitor to a source of the first replica analog output voltage in a second mode of operation, without any charge transfer from or to the first capacitor when switching between the first mode of operation and the second mode of operation.

3. The attenuator circuit of claim 1, wherein the MEMS device has a second output for providing a second analog output voltage, the attenuator circuit further comprising:
a second switch having a first controlled node coupled to the second output of the MEMS device, a second controlled node for receiving a second replica analog output voltage, and a control node for receiving the control signal; and
a second capacitor coupled to the second switch.

4. The attenuator circuit of claim 3, wherein the second switch is configured for coupling the second capacitor to the second output of the MEMS device in a first mode of operation, and for coupling the second capacitor to a source of the second replica analog output voltage in a second mode of operation, without any charge transfer from or to the second capacitor when switching between the first mode of operation and the second mode of operation.

5. The attenuator circuit of claim 1, further comprising a state machine for providing the control signal.

6. The attenuator circuit of claim 5, wherein the state machine comprises a microprocessor, comparator, or window comparator.

7. The attenuator circuit of claim 1, further comprising:
an amplifier coupled to the first output of the MEMS device;
an analog-to-digital converter (ADC) coupled to the amplifier; and
a digital gain correction component coupled to the ADC.

8. The attenuator circuit of claim 7, wherein a digital gain of the digital gain correction component is configured to compensate for an attenuation of the MEMS device provided by the first capacitor.

9. The attenuator circuit of claim 8, wherein the digital gain correction component comprises a digital multiplier.

10. The attenuator circuit of claim 1, further comprising a first buffer amplifier having an input coupled to the first output of the MEMS device, and an output for providing the first replica analog output voltage.

11. The attenuator circuit of claim 10, further comprising:
a second buffer amplifier having an input for receiving a common mode voltage; and
a bias resistor coupled between an output of the second buffer amplifier and the first output of the MEMS device.

12. The attenuator circuit of claim 1, further comprising:
a transistor having a gate coupled to the first output of the MEMS device, and a current path coupled between a first current source and a second current source;
a first replica diode having a current path coupled between the current path of the transistor and a third current source, wherein the first replica diode is configured for providing the first replica analog output voltage.

13. The attenuator circuit of claim 12, wherein the transistor comprises a first PMOS transistor, and wherein the first replica diode comprises a second PMOS transistor matched to the first PMOS transistor.

14. The attenuator circuit of claim 13, further comprising:
a buffer amplifier having an input for receiving a common mode voltage;
a second replica diode coupled to the buffer amplifier;
a fourth current source coupled to the second replica diode; and
a bias resistor coupled between the second replica diode and the first output of the MEMS device.

15. The attenuator circuit of claim 14, wherein second replica diode comprises a third PMOS transistor matched to the first PMOS transistor.

16. The attenuator circuit of claim 3, further comprising a comparator having a first input coupled to the first output of the MEMS device, a second input coupled to the second output of the MEMS device, and an output configured for providing the control signal.

17. The attenuator circuit of claim 16, wherein the comparator comprises a window comparator.

18. The attenuator circuit of claim 1, wherein the first capacitor comprises a plurality of trimmable capacitors.

19. A microphone comprising:
a MEMS device for generating an analog signal in response to ambient sound waves;
a switchable capacitive attenuation component coupled to the MEMS device, the switchable capacitive attenuation component comprising an attenuation capacitor and a switch;
a signal path coupled to the switchable capacitive attenuation component; and
a switchable digital gain correction component coupled to the signal path,
wherein the switchable capacitive attenuation component switches between a first mode of operation to a second mode of operation without any charge transfer from or to the attenuation capacitor, and wherein the switch is selectively coupled between the MEMS device and a plate that is pre-charged to a voltage level tracking the analog signal.

20. A method comprising:

converting an ambient sound wave into an analog signal;

selectively attenuating the analog signal to provide an attenuated analog signal using an attenuation capacitor;

selectively coupling the attenuation capacitor between the analog signal and a replica analog signal;

converting the attenuated analog signal into a digital signal; and selectively digitally correcting the digital signal.

\*  \*  \*  \*  \*